TRANSPARENT MASK AND METHOD FOR MAKING THE SAME

Filed Sept. 11, 1967

INVENTOR.
William M. Kiba
BY Fehr, Hohbach, Test, Albritton & Herbert
Attorneys

3,561,963
TRANSPARENT MASK AND METHOD FOR MAKING THE SAME

William M. Kiba, Pacifica, Calif., assignor to Signetics Corporation, Sunnyvale, Calif., a corporation of California Filed Sept. 11, 1967, Ser. No. 666,907
Int. Cl. G03c 5/00
U.S. Cl. 96—36.2 1 Claim

ABSTRACT OF THE DISCLOSURE

The use of a transparent mask comprising a glass substrate with a stain of elemental copper therein in a process in which a photoresist is exposed to ultraviolet light through the mask.

BACKGROUND OF THE INVENTION

This invention relates to masks for use in making semiconductor devices and in particular masks which can be utilized for exposing photoresist. Masks heretofore provided for exposing photoresist have been opaque or substantially opaque to visible light and, therefore, it has been very difficult to align the same with the wafer which is to be masked because it has been difficult or impossible to see through the mask.

SUMMARY OF THE INVENTION

The transparent mask consists of a substrate which is formed of a material that is substantially transparent to visible light and to ultra-violet light. A mask carried by the substrate forms a predetermined pattern on the substrate. The mask is substantially transparent to visible light and is substantially opaque to ultra-violet light to which photoresist is sensitive. In the preferred embodiment, the mask is in the form of a copper stain which is scratch-resistant.

In general, it is an object of the present invention to provide a mask which is substantially transparent to visible light.

Another object of the invention is to provide a mask which has very high resolution.

Another object of the invention is to provide a mask of the above character which is an integral part of the glass substrate and which is scratch-resistant.

Additional objects and features of the invention will appear from the following description in which the preferred embodiment is set forth in detail in conjunction with the accompanying drawing.

DESCRIPTION OF THE PREFERRED EMBODIMENT

Figure 1:
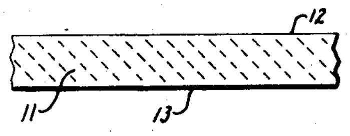
FIG. 1 is a cross-sectional view of the glass substrate utilized in the invention.
Figure 10:
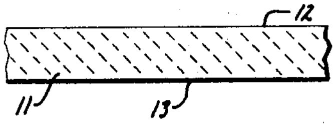
FIGS. 10–17 are cross-sectional views similar to FIGS. 1–8 but show a different method for making the transparent mask.
Figure 2:
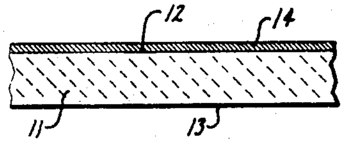
FIG. 2 is a cross-sectional view showing a layer of copper disposed on the substrate.
Figure 11:
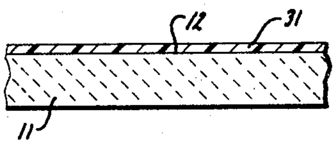
Figure 3:
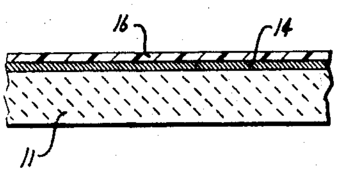
FIG. 3 is a cross-sectional view showing a layer of photoresist disposed on top of the layer of copper carried by the substrate.

The transparent mask or mask assembly 10 consists of a substrate 11 of glass which is substantially transparent to visible light and to ultra-violet light. As is well known to those skilled in the art, glass is normally made by fusing silicates with soda or potash, lime, and sometimes various metal oxides. In general, the glass to be utilized for the substrate is characterized in that it contains at least some boron or sodium. It is also desirable that the glass to be utilized for the substrate be relatively inexpensive and should have good optical characteristics particularly in the ultra-violet region. One type of glass found to have these desirable characteristics is Corning 7740 glass which is a borosilicate glass having an annealing point of 650° C., a softening point of 820° C., and a working point of 1220° C. The 7740 glass has approximately 90% transmission at 350 millimicrons which can be considered to be the start of the ultra-violet region.

The substrate 11 can have any desired dimension and can be formed of any suitable thickness. The substrate should be of a size and thickness so that it can be readily handled. The thickness can vary from approximately .004 to .100 of an inch for the particular application which is envisioned by the present invention.

The substrate is provided with two surfaces 12 and 13 which are generally spaced and parallel through which the light travels. At least one of the surfaces, such as surface 12, should be optically polished to remove all defects. This can be accomplished in a conventional manner by the use of lapping compounds and polishes.

Before commencing with the making of the mask, the glass substrate is first cleaned in a conventional manner by the use of detergents and degreasers in an ultrasonic cleaner. The glass substrate is then removed from the cleaner and dried in a stream of nitrogen.

A continuous layer 14 of essentially copper is deposited upon the optically polished surface 12 of the glass substrate so that it is in direct contact with the surface. The deposition of the copper upon the glass substrate can be accomplished in any conventional manner. For example, the layer can be deposited by vapor plating the same on one of the polished surfaces of the substrate to a thickness ranging from 450 to 2000 Angstroms, and preferably a thickness of approximately 1600 Angstroms.

After the copper layer 14 has been deposited upon the substrate, a thin layer 16 of a suitable photoresist such as KTFR manufactured by Eastman Kodak is placed upon the copper layer. This can be accomplished in a conventional manner such as by dropping a few drops of the KTFR, which is a liquid, onto the copper layer and spinning the glass substrate at a speed of approximately 1000 r.p.m. for a period of approximately 15 seconds to cause the KTFR to spread to a uniform thickness. The glass substrate with the KTFR is then baked in a suitable furnace at 80° C. for a period of approximately 15 minutes in a nitrogen atmosphere.

Figure 4:
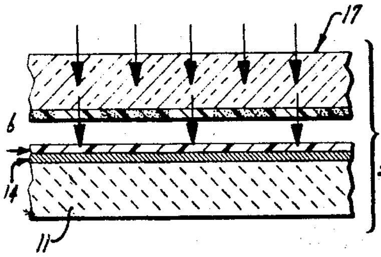
FIG. 4 is a cross-sectional view showing the exposure of the photoresist by ultra-violet through a mask.
Figure 13:
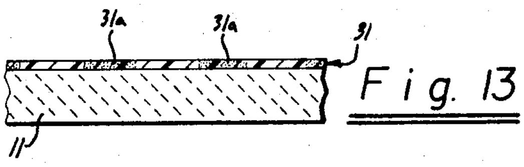

The KTFR is then exposed to ultra-violet light (see FIG. 4) for a period of 30 to 60 seconds through a conventional mask 17, such as a plastic emulsion mask, to transfer the image carried by the emulsion mask to the KTFR to provide ultra-violet exposed portions 16*a* which form a predetermined pattern in the KTFR corresponding to the mask 17. After exposure, the KTFR is developed in a KTFR developer for a period of approximately 20 seconds at room temperature. The developer develops the portions 16_a_ which have been exposed to the ultra-violet light and removes the portions 16_b_ which have not been exposed to ultra-violet light so that the portions 14_a_ of the copper plating which are covered by the developed KTFR correspond to the desired pattern. After developing, the glass substrate is rinsed in TCE (trichloroethylene) for approximately 5 seconds. It is then rinsed in methyl alcohol and blown dry by a stream of nitrogen.

The next step is to remove portions of the copper plating 14 which are not covered by the developed KTFR. This is accomplished in a suitable manner such as by etching the exposed copper away with a solution of ferric chloride ($FeCl_3$) and water. One solution found to be satisfactory consists of 30 grams of ferric chloride in 1200 milliliters of water. This etching operation is continued until the exposed copper plating is removed to provide a clean pattern which is formed of the remaining copper which is in direct contact with the glass substrate. This normally can be accomplished in approximately 15 to 18 seconds at 25° C. The substrate is then rinsed in deionized water for a few seconds. It is unnecessary to remove the remaining photoresist because it is incinerated or destroyed in the subsequent operations.

The oxidation and ion exchange step is next carried out by placing the glass substrate in a conventional diffusion-type furnace operating at a temperature which is at least slightly above the annealing temperature of the glass substrate being used. The tube of the diffusion furnace in which the glass substrate is carried is connected to a number of gas supplies of different types of gases, the flow of which can be readily controlled. The first gas supply consists of 100% oxygen ($O_2$); a second gas supply of 100% sulfur dioxide ($SO_2$); a third gas supply consisting of a mixture of hydrogen ($H_2$) and nitrogen ($N_2$), consisting of 20% hydrogen and 80% nitrogen; and a fourth gas supply of 100% nitrogen ($N_2$). In one arrangement for making the mask, the oxygen and the sulfur dioxide were connected through separate valves and through separate flow meters to the diffusion furnace, whereas the hydrogen and nitrogen mixture and the nitrogen were supplied through two separate control valves to a single flow meter to the furnace. The presence of sodium ions in the diffusion environment and, particularly, on the surface of the glass substrate seems to enhance the oxidation and ion exchange mechanism, resulting in a more uniform diffusion of copper into the substrate surface to provide a stain 18 on the surface 12 of the glass substrate 11. The sodium ions can be admitted to the diffusion furnace by passing the $N_2$ carrier gas over a heated boat of sublimating sodium chloride. Alternately, all the gases, before entering the furnace, can be passed or bubbled through a saturated sodium chloride solution consisting of sodium chloride and deionized water at 25° C.

In the preferred method, the following gases were supplied to the diffusion furnace for the following times. Initially, the mixture of 80% nitrogen and 20% hydrogen is supplied to the furnace which can be termed the forming gas at a rate of 2200 cc. per minute. The glass plate or substrate is then introduced and is exposed to the mixture of nitrogen and oxygen for a period of 30 seconds. This exposure to the 80% nitrogen and 20% hydrogen during the first 30 seconds prevents any reaction of the copper with the sulphur dioxide until the substrate reaches 600° C. Immediately after the termination of the 30 seconds, the furnace is flushed with the 100% nitrogen gas for a period of approximately 30 seconds to flush any hydrogen from the furnace to prevent an explosion when the oxygen and sulphur dioxide are introduced. Thereafter, for a period of approximately 4 minutes, oxygen is introduced at the rate of 350 cc. per minute and sulphur dioxide is introduced at 250 cc. per minute. It is believed that the sulphur dioxide acts as a catalyst for the ion exchange and that it serves as a leaching agent to leach the sodium from within the glass. Thereafter, the diffusion furnace is again flushed with the 100% nitrogen during the time that the substrate is being unloaded. Thus, it can be seen that the operation consumes a period of approximately 5 minutes. Preferably, the temperature of the furnace should be maintained at 600° C. ±1° C. during the entire process. However, temperatures ranging from slightly above the annealing temperature and below the melting temperature of the glass substrate can be used.

Although it is not exactly understood what occurs during this oxidation or ion exchange step, it is believed that when the substrate is placed in the furnace, oxidation or ion exchange occurs. By this is meant that either the boron or sodium contained by the glass is brought to the surface which leaves a void in the glass. It is believed that this void is filled by the copper which enters the voids to provide an ion exchange in which the sodium is exchanged for the copper. At this stage of the process, the copper on the glass substrate gives the appearance of a yellowish colored stain.

After the substrate has been removed from the furnace, the next step is to remove the sodium or boron which has come to the surface of the substrate and which has primarily combined with the sulfur dioxide to form salts. The salts are water-soluble and are removed by scrubbing the substrate with a sponge in deionized water. After all the residue has been removed, the substrate is blown dry in a stream of nitrogen.

The glass substrate is then again introduced into the furnace at 600° C. with the 100% nitrogen flowing through the furnace. Thereafter, forming gas (80% nitrogen and 20% hydrogen) is introduced into the furnace at a rate of 2.2 liters per minute for a period of approximately 5 minutes. The forming gas reduces and actually diffuses the hydrogen into the glass where it reduces any copper oxide which it is believed is the yellow stain in the glass from the oxide state into essentially elemental copper within the glass substrate so that the stain 18 is essentially copper and is substantially reddish in appearance to the human eye under normal daylight. Thereafter, nitrogen is introduced into the furnace and the substrate is removed and cooled to provide a completed transparent mask. The surface 12 of the mask 10 is planar throughout and the stain 18 extends downwardly from this planar surface 12 to provide a mask which has excellent resolution.

By way of example, it has been found that at a wavelength of 350 millimicrons, the 7740 glass had 90% transmission; the Kodak emulsion mask utilized had 84% transmission; and the stain itself had 3% transmission. It was also found that the 7740 glass had a cut-off frequency at 260 millimicrons and that the Kodak emulsion mask had a cut-off frequency at 300 millimicrons. The stain made in accordance with the present invention had 1.5% transmission at 300 millimicrons and 0% transmission at 260 millimicrons.

The photoresist which was utilized with the transparent mask had a spectral sensitivity ranging from 260 millimicrons to 460 millimicrons.

In one embodiment of the present invention utilizing the 7740 glass substrate, the glass with the stain therein had the transmissivity shown below.

| Wavelength, millimicrons: | Transmissivity, percent |
|---|---|
| 260 | 0 |
| 460 | 8 |
| 480 | 10 |
| 575 | 17 |
| 650 | 76 |
| 750 | 85 |

The stain utilizing the 7740 glass had a depth extending from the top of the optically polished surface 12 ranging from 6 to 7 microns. It is only necessary that the depth of this stain be sufficient to obtain the desired opacity. However, with certain types of glasses having a high sodium content, it is possible to obtain a concentration which makes it possible to reduce the depth of the stain substantially. Thus, with improved concentration of the copper near the surface, the depth of the stain can be reduced. Preferably, the stain should be as shallow as possible, as for example, one micron, while still retaining the desired optical characteristics, i.e., the opacity desired in the ultra-violet region. This makes it easier to control the lateral dimensions of the stain and to obtain resolutions greater than 1/10 of a mil in line dimension.

Figure 9:
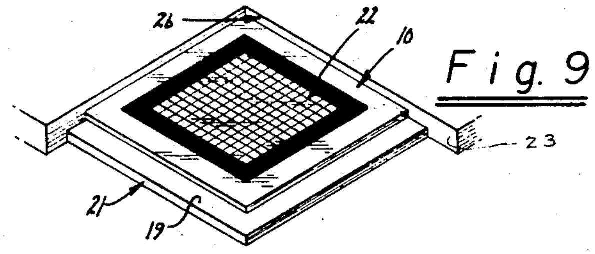
FIG. 9 is a greatly enlarged isometric view of a transparent mask incorporating the present invention and showing its use for making a pattern on photoresist carried by a semiconductor body.

Use of the transparent mask 10 is shown in FIG. 9 which is utilized for exposing a layer of photoresist 19 carried by a semiconductor wafer 21. The transparent mask is provided with a pattern 22 which is aligned with a pattern or other indicia (not shown) carried by the semiconductor body 21 under visible light passing through the pattern carried by the transparent mask 10, which may include a guide or alignment surface 23, as by the use of conventional mask alignment apparatus (not shown). After the mask has been aligned with the semiconductor body, the photoresist 19 carried by the semiconductor body is exposed to ultra-violet through the mask 10 from a suitable ultra-violet source mounted in the masking apparatus. After the photoresist carried by the semiconductor body has been exposed in accordance with the pattern carried by the mask 10, the semiconductor body can be processed in the conventional manner to provide a plurality of chips or dies, each of which carries an integrated circuit or other semiconductor device.

Figure 12:
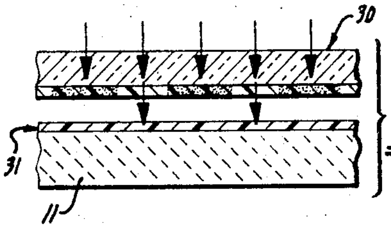
Figure 14:
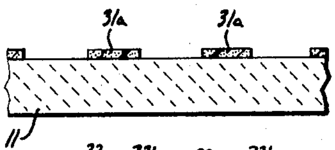
Figure 5:
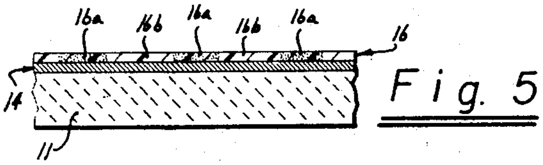
FIG. 5 is a cross-sectional view showing the exposed portions of the photoresist.
Figure 15:
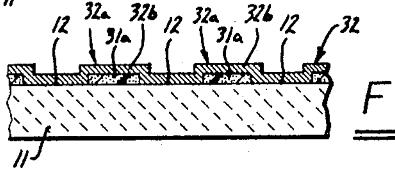
Figure 6:
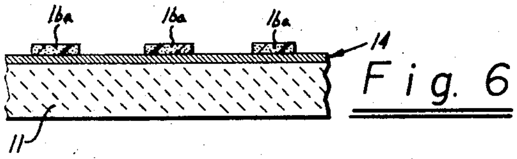
FIG. 6 shows the photoresist after the unexposed portions have been removed.
Figure 16:
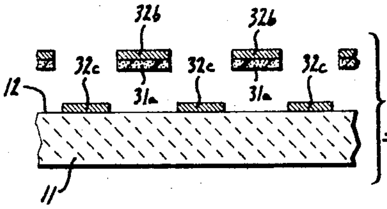
Figure 7:
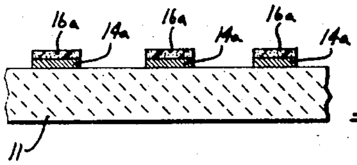
FIG. 7 is a cross-sectional view showing the exposed copper etched away.

Another embodiment of the method for making the transparent mask is shown in FIGS. 10–17. As in the method previously described in connection with FIGS. 1–8, the method is commenced by utilizing a substrate 11 having spaced parallel surfaces 12 and 13 of which at least one such surface 12 is optically polished. A layer of photoresist 31 is placed on the surface 12 as, for example, by spinning on a suitable liquid photoresist such as AZ–1350 supplied by Shippley Chemical Company and baking the same at 80° C. for approximately 30 minutes. Thereafter, as shown in FIG. 12, the photoresist layer 31 is exposed to ultra-violet light through a mask 30 to provide ultra-violet exposed portions 21*a* which form a pattern corresponding to the pattern of the mask 32. The photoresist which is exposed to the ultra-violet is polymerized. After the photoresist has been exposed, the exposed portions are removed by suitable developer such as AZ developer mixed with equal parts of water so that only the unexposed portions 31*a* of the photoresist remain as shown in FIG. 14.

Copper is then deposited on exposed portions of the top surface 12 of the glass substrate 11 and over the photoresist portions 31*a* on the glass substrate 11 to provide a continuous overlying layer 32 which has raised portions or steps 32*a*. The copper which is overlying the photoresist portions 31*a* is then lifted off by utilizing a suitable solvent such as an acetone solvent which dissolves the photoresist. As soon as the photoresist is dissolved, the portions 32*b* of the copper overlying the photoresist are readily removed or lifted off to leave remaining portions 32*c* of copper which correspond to the desired pattern for the substrate 11. It has been found that the copper layer 32 which is deposited upon the substrate 11 is sufficiently thin so that the acetone solvent can penetrate the same and dissolve the photoresist underlying the same to permit the lift-off hereinbefore described. The solvent tends to first penetrate the layer 32 at the steps

32*a* and then cracks are formed around the steps so that there is a sharp break in the copper portions. This ensures that there is no gradient in thickness in the copper portions 32*c* which remain.

Figure 8:
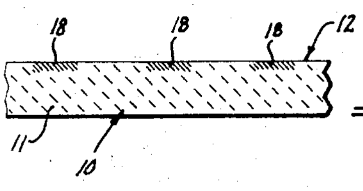
FIG. 8 is a glass substrate showing the stain formed therein on one surface thereof.
Figure 17:
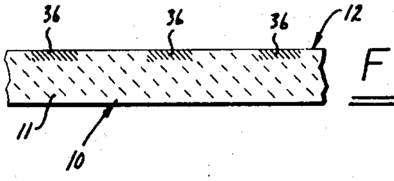

After the copper portions 32*b* overlying the photoresist portion 31*a* have been removed, an oxidation and ion exchange step substantially identical to that hereinbefore described with the method shown in FIGS. 1–8 is carried out to provide a stain 36 which corresponds to the stain 18 in FIG. 8. The mask 10 can be utilized in the same manner as the mask 10 made in accordance with the steps shown in FIGS. 1–8.

It has been found that this mask has many advantageous features. First, the copper stain provides the pattern which corresponds to the desired pattern. The copper stain forms an integral part of the glass substrate and plate. It has a long life because it is relatively scratch-resistant and thus the images or pattern can only be destroyed if the substrate is destroyed. An additional very important advantage of this mask is that the copper stain is substantially transparent to visible light but is opaque to ultra-violet light. By ultra-violet light, it is meant the portion of the ultra-violet spectrum to which the photoresist being used is sensitive. This is particularly advantageous in the use of the mask because it makes it possible to align the mask with the pattern on the semiconductor, e.g., silicon wafer, below the mask by aligning the same by the visible light passing through the mask. The resolution which can be obtained with such a mask is excellent.

From the foregoing, it can be seen that the mask was opaque or substantially opaque to ultra-violet light which is normally considered ranging from 350 to 10 millimicrons and that it was substantially transparent to visible light normally considered as ranging from 400 to 720 millimicrons.

I claim:

1. In a method for exposing a layer of photoresist carried by a semiconductor wafer, providing a source of ultra-violet light which is adapted to impinge upon the photoresist carried by the semiconductor wafer and placing a transparent mask between the source of ultra-violet light and the photoresist carried by the semiconductor wafer, said transparent mask being formed of glass and having a stain formed therein which is formed essentially of elemental copper which is substantially transparent to visible light and substantially opaque to ultra-violet light whereby said mask can be utilized to form a pattern in the photoresist carried by the semiconductor wafer.

References Cited

UNITED STATES PATENTS

| | | | |
|---|---|---|---|
| 2,732,298 | 1/1956 | Stookey | 96—34 |
| 2,904,432 | 9/1959 | Ross | 96—34 |
| 2,911,749 | 11/1959 | Stookey | 96—34 |

OTHER REFERENCES

Metal on Glass Masks, George and Seaman, "The Western Electric Engineer," April 1967 (pp. 29–30).

NORMAN G. TORCHIN, Primary Examiner

J. R. HIGHTOWER, Assistant Examiner

U.S. Cl. X.R.

96—44